US012625213B2

(12) United States Patent
Goel et al.

(10) Patent No.: US 12,625,213 B2
(45) Date of Patent: May 12, 2026

(54) SYSTEM AND METHOD FOR DETECTING MOTION-RIDDEN SHOTS IN MULTI-SHOT ACQUISITIONS AND UTILIZING DEEP LEARNING BASED RECONSTRUCTION FOR MOTION CORRECTION

(71) Applicant: GE Precision Healthcare LLC, Waukesha, WI (US)

(72) Inventors: Megha Goel, Bangalore (IN); Sudhanya Chatterjee, Bangalore (IN); Sajith Rajamani, Bangalore (IN); Sudhir Ramanna, Bangalore (IN); Preetham Shankpal, Bangalore (IN); Imam Ahmed Shaik, Bhalki (IN); Suresh Emmanuel Devadoss Joel, Bangalore (IN); Florintina Chaarlas, Bangalore (IN); Harsh Kumar Agarwal, Jaipur (IN)

(73) Assignee: GE Precision Healthcare LLC, Waukesha, WI (US)

( * ) Notice: Subject to any disclaimer, the term of this patent is extended or adjusted under 35 U.S.C. 154(b) by 149 days.

(21) Appl. No.: 18/629,081

(22) Filed: Apr. 8, 2024

(65) Prior Publication Data
US 2025/0314728 A1    Oct. 9, 2025

(51) Int. Cl.
*G01R 33/56* (2006.01)
*G01R 33/561* (2006.01)
*G01R 33/565* (2006.01)

(52) U.S. Cl.
CPC ...... *G01R 33/5608* (2013.01); *G01R 33/5611* (2013.01); *G01R 33/56509* (2013.01)

(58) Field of Classification Search
CPC .......... G01R 33/5608; G01R 33/56509; G01R 33/5611
See application file for complete search history.

(56) References Cited

U.S. PATENT DOCUMENTS

2022/0172410 A1*   6/2022   Wheaton ............... G06T 11/005
2022/0336085 A1*  10/2022   Kunze ................... G06V 10/25
(Continued)

OTHER PUBLICATIONS

Rotman, Michael et al., "A Novel Approach for Correcting Multiple Discrete Rigid In-Plane Motions Artefacts in MRI Scans," School of Computer Science, Tel-Aviv University, Tel-Aviv, Israeil, arXiv:2006.13804v2 [eess.IV] Jun. 29, 2020, 7 pgs.
(Continued)

*Primary Examiner* — Rishi R Patel
(74) *Attorney, Agent, or Firm* — Fletcher Yoder, P.C.

(57) ABSTRACT

A method includes obtaining k-space data, wherein a plurality of navigator like echoes of the k-space data including an additional navigator like echo are acquired for each shot or a group of shots. The k-space data is motion corrupted. The method includes identifying any shots where a subject moved during acquisition based on the respective additional navigator like echoes. The method includes generating dominant pose k-space data based on identification of any shots where the subject moved during acquisition, the dominant pose k-space data includes only shots not affected by movement, wherein the dominant pose k-space data is missing k-space data due to rejecting the shots where the subject moved. The method includes utilizing a deep learning-based reconstruction model on the motion-corrupted k-space data to modify motion-corrupted k-space data with k-space data that is consistent with the dominant pose k-space data to generate a reconstructed image.

14 Claims, 13 Drawing Sheets

236

Obtain K-Space Data Including Additional Navigator Like Echo in Each Shot or a Group of Shots — 238

Identify Shots where Subject Moved During Acquisition Based on Respective Additional Navigator Like Echoes — 240

Generate Dominant Pose K-Space Data Based on Only Shots Not Affected by Movement of Subject — 242

Utilize Deep Learning-Based Reconstruction Model on Motion-Corrupted K-Space Data to Generate Reconstructed Image — 244

Store/Display Reconstructed Image — 246

(56) References Cited

U.S. PATENT DOCUMENTS

| | | |
|---|---|---|
| 2022/0342018 A1 | 10/2022 | Splitthoff et al. |
| 2023/0160989 A1 | 5/2023 | Polak et al. |
| 2023/0186532 A1* | 6/2023 | Schuelke ........... G01R 33/4818 |
| | | 324/309 |
| 2023/0293039 A1 | 9/2023 | Polak et al. |
| 2024/0219502 A1* | 7/2024 | Haji-Valizadeh ........................... |
| | | G01R 33/5676 |

OTHER PUBLICATIONS

Rotman, Michael et al. "Correcting motion artifacts in MRI scans using a deep neural network with automatic motion timing detection," Proc. SPIE 11595, Medical Imaging 2021: Physics of Medical Imaging, 1159514 (Feb. 15, 2021; doi: 10.1117/12.2580869, 11 pgs.
Jansen, Isabelle et al., "A deep network for continuous motion detection during MRI scanning," GE Global Research Center-USA, GE Global Research Center, Herzliya, Israel, https://index.mirasmart.com/IMSMRM2020/PDFfiles/3364.html, 3 pgs.
Brada, Rafi et al., "Towards motion-robust MRI—Autonomous motion timing and correction during MR scanning using multi-coil data and deep-learning neural network," GE Global Research Center, Herzliya, Israel, GE Global Research Center-USA, Jun. 22, 2021, https://index.mirasmart.com/IMSMRM2019/PDFfiles/4438.html, 3 pgs.
Brada, Rafi et al., "Perceptual motion scoring: An algorithm for automated detection and grading of MRI motion artifacts," GE Global Research Center, Herzliya, Israel, GE Global Research Center-USA, Jun. 22, 2021, https://index.mirasmart.com/IMSMRM2021/PDFfiles/1366.html, 3 pgs.
U.S. Appl. No. 18/331,885, filed Jun. 8, 2023, Sudhanya Chatterjee.
Slipsager et al., "Quantifying the Financial Savings of Motion Correction in Brain MRI a Model-Based Estimate of the Costs Arising From Patient Head Motion and Potential Savings From Implementation of Motion Correction," DTU Library, 2020, 30 pgs.
Polak et al., "Motion guidance lines for robust data—consistency based retrospective motion correction in 2D and 3D MRI," Magn Reson Med, 2023, 24 pgs.

* cited by examiner

100

128

120    130  132  134

150  AMP./ Cont.

136

122    126    138

124

140

102

152  T / R / amp.

154  Receive Array Switch

158  Inter.

160  Control Circuit

162  Mem.

164  Inter.

156  Rx Circuit

104

106

174  Printer    176  Monitor    178  User Interface

166  Inter.

168  Control Circuit

170  Mem.

172  Inter.

108  PACS/ Telerad 318                                          322

324                                              328

330        334

SYSTEM AND METHOD FOR DETECTING MOTION-RIDDEN SHOTS IN MULTI-SHOT ACQUISITIONS AND UTILIZING DEEP LEARNING BASED RECONSTRUCTION FOR MOTION CORRECTION

BACKGROUND

The subject matter disclosed herein relates to medical imaging and, more particularly, to a system and a method for detecting motion-ridden shots in multi-shot acquisitions and utilizing deep learning-based reconstruction for motion correction.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During magnetic resonance imaging (MRI), when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_r$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Since MRI acquisitions are relatively long (e.g. greater than one minute), there is a chance that patient movement may occur during the scan. This caused ghosting or blurring-like artifacts to manifest in the reconstructed image, which makes the image non-diagnostic. While patients are trained before scanning to be still, motion may still occur for patients (e.g., patients who are in pain).

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a computer-implemented method is provided. The computer-implemented method includes obtaining, via a processor, k-space data of a subject with a magnetic resonance imaging (MRI) scanner acquired, wherein the k-space data is motion corrupted, and wherein a plurality of navigator like echoes of the k-space data including an additional navigator like echo are acquired for each shot or a group of shots of a plurality of shots for a respective slice. The computer-implemented method also includes identifying, via the processor, any shots of the plurality of shots where the subject moved during acquisition based on the respective additional navigator like echoes for the plurality of shots. The computer-implemented method further includes generating, via the processor, dominant pose k-space data based on identification of any shots of the plurality of shots where the subject moved during acquisition, the dominant pose k-space data includes only shots of the plurality of shots not affected by movement of the subject during acquisition, wherein the dominant pose k-space data is missing k-space data due to rejecting the shots where the subject moved during acquisition. The computer-implemented method even further includes utilizing, via the processor, a deep learning-based reconstruction model on motion-corrupted k-space data to modify the motion-corrupted k-space data with k-space data that is consistent with the dominant pose k-space data to generate a reconstructed image.

In another embodiment, a system is provided. The system includes a memory encoding processor-executable routines. The system also includes a processor configured to access the memory and to execute the processor-executable routines, wherein the process-executable routines, when executed by the processor, cause the processor to perform actions. The actions include obtaining k-space data of a subject acquired with a magnetic resonance imaging (MRI) scanner, wherein the k-space data is motion corrupted, and wherein a plurality of navigator like echoes of the k-space data including an additional navigator like echo are acquired for each shot or a group of shots of a plurality of shots for a respective slice. The actions also include identifying any shots of the plurality of shots where the subject moved during acquisition based on the respective additional navigator like echoes for the plurality of shots. The actions further include generating dominant pose k-space data based on identification of any shots of the plurality of shots where the subject moved during acquisition, the dominant pose k-space data includes only shots of the plurality of shots not affected by movement of the subject during acquisition, wherein the dominant pose k-space data is missing k-space data due to rejecting the shots where the subject moved during acquisition. The actions even further include utilizing a deep learning-based reconstruction model on the motion-corrupted k-space data to modify the motion-corrupted k-space data with k-space data that is consistent with the dominant pose k-space data to generate a reconstructed image.

In a further embodiment, a non-transitory computer-readable medium, the computer-readable medium including processor-executable code that when executed by a processor, causes the processor to perform actions. The actions include obtaining k-space data of a subject acquired with a magnetic resonance imaging (MRI) scanner, wherein the k-space data is motion corrupted, wherein a plurality of navigator like echoes of the k-space data including an additional navigator like echo are acquired for each shot of a plurality of shots for a respective slice. The computer-implemented method also includes identifying any shots of the plurality of shots where the subject moved during acquisition based on the respective additional navigator like echoes for the plurality of shots. The computer-implemented method further includes generating dominant pose k-space data based on identification of any shots of the plurality of shots where the subject moved during acquisition, the dominant pose k-space data includes only shots of the plurality of shots not affected by movement of the subject during acquisition, wherein the dominant pose k-space data is missing k-space data due to rejecting the shots where the subject moved during acquisition. The computer-implemented method even further includes utilizing a deep learning-based reconstruction model on the motion-corrupted k-space data to modify the motion-corrupted k-space data with k-space data that is consistent with the dominant pose k-space data to generate a reconstructed image.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

Figure 1:
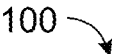
FIG. 1 illustrates a schematic diagram of a magnetic resonance imaging (MRI) system suitable for use with the disclosed techniques.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

Deep learning (DL) approaches discussed herein may be based on artificial neural networks, and may therefore encompass one or more of deep neural networks, fully connected networks, convolutional neural networks (CNNs), transformer-based networks, unrolled neural networks, perceptrons, encoders-decoders, recurrent networks, wavelet filter banks, u-nets, general adversarial networks (GANs), dense neural networks, or other neural network architectures. The neural networks may include shortcuts, activations, batch-normalization layers, and/or other features. These techniques are referred to herein as DL techniques, though this terminology may also be used specifically in reference to the use of deep neural networks, which is a neural network having a plurality of layers.

As discussed herein, DL techniques (which may also be known as deep machine learning, hierarchical learning, or deep structured learning) are a branch of machine learning techniques that employ mathematical representations of data and artificial neural networks for learning and processing such representations. By way of example, DL approaches may be characterized by their use of one or more algorithms to extract or model high level abstractions of a type of data-of-interest. This may be accomplished using one or more processing layers, with each layer typically corresponding to a different level of abstraction and, therefore potentially employing or utilizing different aspects of the initial data or outputs of a preceding layer (i.e., a hierarchy or cascade of layers) as the target of the processes or algorithms of a given layer. In an image processing or reconstruction context, this may be characterized as different layers corresponding to the different feature levels or resolution in the data. In general, the processing from one representation space to the next-level representation space can be considered as one 'stage' of the process. Each stage of the process can be performed by separate neural networks or by different parts of one larger neural network.

The present disclosure provides systems and methods for detecting motion-ridden shots in multi-shot acquisitions and utilizing deep learning-based reconstruction (e.g., unrolled deep learning-based reconstruction) for motion correction. The disclosed systems and methods utilize a retrospective motion correction which is able to correct for rigid, non-rigid, in-plane, and out-of-plane motion in MRI data. The disclosed systems and methods utilize two modules: one for motion detection and one for motion correction. The module for motion correction is informed by the output of the motion detection module. The motion correction unit perform reconstruction in a physics driven artificial intelligence framework. In particular, a pulse sequence diagram (e.g., of a multi-shot sequence (e.g., fast spin echo sequence) or a single shot sequence with multiple number of excitations (NEX)) is modified to acquire an additional navigator like echo (e.g., a near-center (within 10 percent) phase encode line, frequency encode line, clover leaf acquisition, etc.) in each shot or a group (e.g., subset) of shots. The disclosed systems and methods do not require additional equipment or an increase in scan time. Since there is enough system dead time in each shot, the extra line is easily accommodated without increasing scan time. Further, these additional navigator like echoes (which serve as guiding lines) are used to detect the shots which are in a consistent (e.g., dominant) pose. Outlier shots (i.e., of non-dominant poses of the subject where the subject moved during data acquisition or the scan) are dropped and reconstructed instead using deep learning-based reconstruction (e.g., unrolled deep learning-based reconstruction). All kinds of motion will appear as outliers in the shots.

The disclosed embodiments include obtaining k-space data of a subject acquired with a magnetic resonance imaging (MRI) scanner, wherein the k-space data is motion corrupted, wherein a plurality of navigator like echoes of the k-space data including an additional navigator like echo are acquired for each shot or a group of shots of a plurality of shots for a respective slice. Each additional navigator like echo may be a near-center (within 10 percent) phase encode line, frequency encode line, a clover leaf acquisition, or other type of navigator like echo. The disclosed embodiments also include identifying any shots of the plurality of shots where the subject moved during acquisition based on the respective additional navigator like echoes for the plurality of shots. The disclosed embodiments further include generating dominant pose k-space data based on identification of any shots of the plurality of shots where the subject moved during acquisition, the dominant pose k-space data includes only shots of the plurality of shots not affected by movement of the subject during acquisition, wherein the dominant pose k-space data is missing k-space data due to rejecting the shots where the subject moved during acquisition. The disclosed embodiments even further include utilizing a deep learning-based reconstruction model (e.g., unrolled deep learning-based reconstruction model) on the motion-corrupted k-space data to modify the motion-corrupted k-space data with k-space data that is consistent with the dominant pose k-space data to generate a reconstructed image.

In certain embodiments, the additional navigator like echo is acquired at a start, a middle, or an end of each shot of the plurality of shots where the additional navigator like echo is acquired. In certain embodiments, the additional navigator like echo is a near center phase encode line which lies within nearest 10 percent of area around the center of the k-space. The additional navigator like echo is acquired in the same place in all shots where the additional navigator like echo is acquired.

In certain embodiments, the systems and methods include comparing the respective additional navigator like echoes for the plurality of shots to identify a subset of shots of the plurality of shots that corresponds to the dominant pose of the subject and to identify any shots of the plurality of shots where the subject moved during acquisition. In certain embodiments, comparing the respective navigator like echoes includes clustering the respective additional navigator like echoes to obtain positioning information to predict any shot where the subject moved during acquisition.

In certain embodiments, the systems and methods include generating, via the processor, a k-space mask from the k-space data utilizing only the shots not affected by movement of the subject during acquisition, wherein the k-space mask is configured to mask the shots where the subject moved during acquisition. In certain embodiments, the systems and methods also include applying, via the processor, the k-space mask to the k-space data to generate the dominant pose k-space data.

In certain embodiments, utilizing the deep learning-based reconstruction model on the motion-corrupted k-space data include the following actions. The actions includes transforming the k-space data to motion-corrupted image. In certain embodiments, the actions also include transforming centrally located phase encoded lines (e.g., obtained from both motion-corrupted and uncorrupted shots) from the k-space data into a contrast image. In certain embodiments, the actions further include inputting both the motion-corrupted image and the contrast image into the deep learning-based reconstruction model, wherein the dominant pose k-space data utilized for application of soft data consistency in an unrolled framework. The actions even further include outputting from the deep learning-based reconstruction model the reconstructed image. In certain embodiments, the motion-corrupted image (without the contrast image) is inputted into the deep learning-based reconstruction model, wherein the dominant pose k-space data utilized for application of soft data consistency in an unrolled framework.

The disclosed embodiments improve system throughput by reducing patient rescans/recalls due to motion related artifacts. The disclosed embodiments improve patient comfort due to motion tolerance and less patient recall. The disclosed embodiments would be helpful when scanning uncompliant patients and children/infants. The disclosed embodiments are able to detect and to correct for in-plane, out-of-plane, rigid, and non-rigid motion for all anatomies and contrasts.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 (e.g., subject) to be positioned therein for imaging selected anatomy within the patient.

Scanner 102 includes a series of associated coils for producing controlled magnetic fields for exciting the gyromagnetic material within the anatomy of the patient being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, Bo. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to generate a variety of data for training a deep learning-based segmentation model as described below. In certain embodiments, the memory circuit 170 may store one or more neural networks (e.g., deep learning-based reconstruction model such as unrolled deep learning-based reconstruction model). In certain embodiments, the disclosed techniques may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
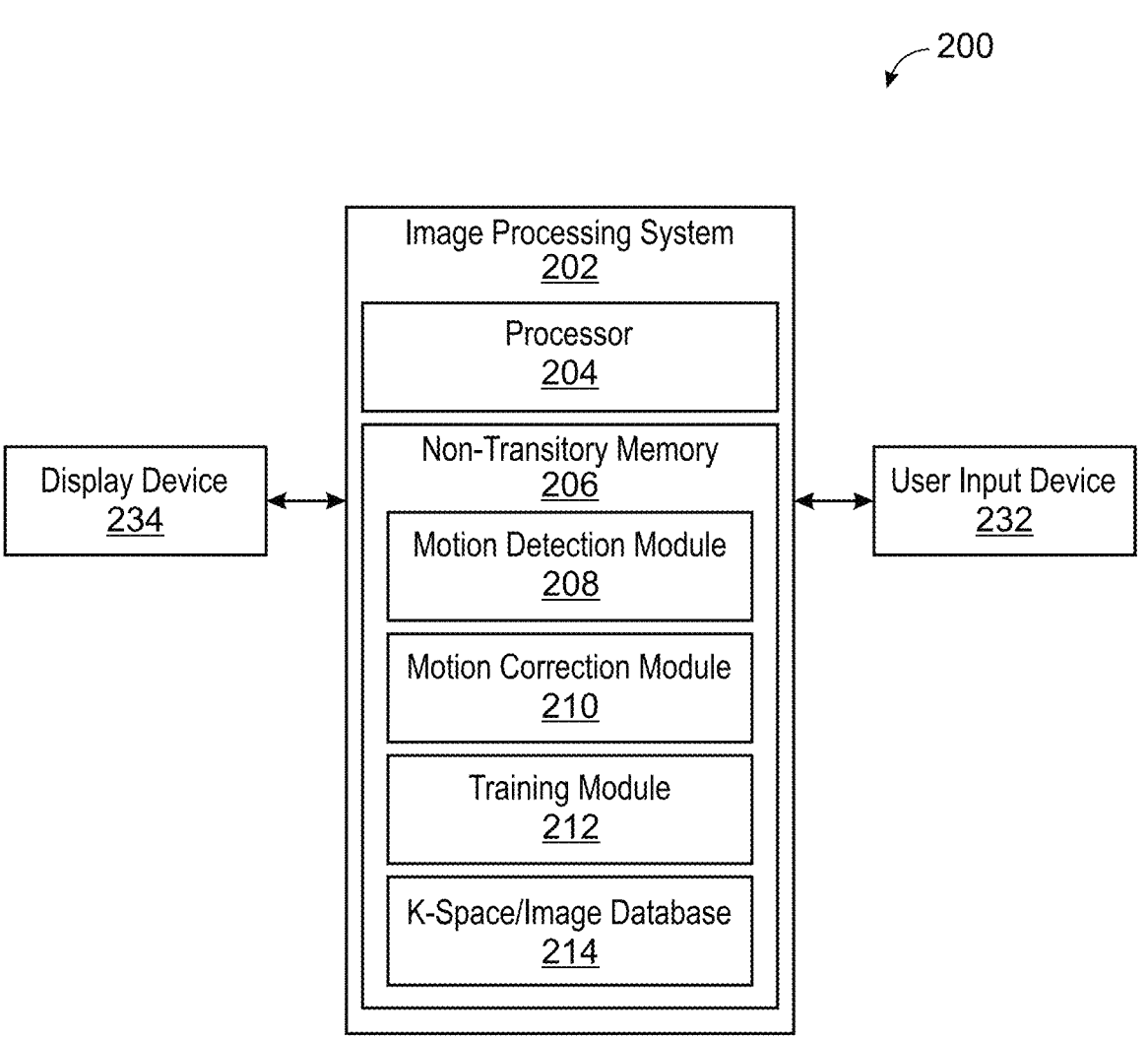
FIG. 2 is a schematic diagram of an image processing system, in accordance with aspects of the present disclosure.

Referring to FIG. 2, an image processing system 202 configured to receive and process k-space data is shown. In some embodiments, the image processing system 202 is incorporated into the MRI system 100. For example, the image processing system 202 may be provided in the MRI system 100 as data processing unit. In some embodiments, at least a portion of image processing system 202 is disposed at a device (e.g., edge device, server, etc.) communicably coupled to the MRI system 100 via wired and/or wireless connections. In some embodiments, at least a portion of image processing system 202 is disposed at a separate device (e.g., a workstation) which can receive k-space data from the MRI system 100 or from a storage device which stores the images/k-space data generated by the MRI system 100. The image processing system 202 may be operably/communicatively coupled to a user input device 232 and a display device 234. User input device 232 may be integrated into an MRI system, such as at user input device of the MRI system 100. Similarly, display device 234 may be integrated into an MRI system, such as at display device of MRI system 100.

The image processing system 202 includes a processor 204 configured to execute machine readable instructions stored in non-transitory memory 206. The processor 204 may be single core or multi-core, and the programs executed thereon may be configured for parallel or distributed processing. In some embodiments, the processor 204 may optionally include individual components that are distributed throughout two or more devices, which may be remotely located and/or configured for coordinated processing. In some embodiments, one or more aspects of processor 204 may be virtualized and executed by remotely-accessible networked computing devices configured in a cloud computing configuration.

Then non-transitory memory 206 may store a motion detection module 208, a motion correction module 210 (e.g., reconstruction module), a training module 212, and a k-space/image database 214. Motion detection module 208 may be configured to detect shots (ETLs) of k-space data that are affected by motion. The motion detection module 208 is configured to obtain k-space data of a subject acquired with a magnetic resonance imaging (MRI) scanner utilizing a single-shot or multi-shot pulse sequence (e.g., fast spin echo sequence, echo planar sequence, spin echo sequence, gradient echo sequence, stimulated echo sequence, or combinations of these two-dimensional or three-dimensional sequences), wherein a plurality of navigator like echoes of the k-space data (representing the plurality of echoes received in a same repetition after an excitation pulse for a respective shot) including an additional navigator like echo are acquired for each shot or a group of shots of a plurality of shots for a respective slice. Each additional navigator like echo may be a near-center (within 10 percent) phase encode line, frequency encode line, a clover leaf acquisition, or other type of navigator like echo. The k-space data may be motion-corrupted. The k-space data is obtained from the k-space/image database 214. In certain embodiments, the k-space data is acquired during the multi-shot pulse sequence with multiple coils over a plurality of excitations (i.e., a number of excitations (NEX) or number of signal averages per acquisition) in which multiple shots will be acquired during each excitation. In certain embodiments, the additional navigator like echo is acquired at a start, a middle, or an end of each shot of the plurality of shots for the respective slice where the additional like navigator like echo is acquired. In certain embodiments, the additional navigator like echo is a near-zero phase encode line is located within the central 10 percent region of k-space. The position and trajectory of the additional navigator like echo is the same across the plurality of shots. The motion detection module 208 is also configured to identify any shots of the plurality of shots where the subject moved during acquisition based on the respective additional navigator like echoes for the plurality of shots. In certain embodiments, the motion detection module 208 is configured to compare the respective additional navigator like echoes for the plurality of shots to identify a subset of shots of the plurality of shots that corresponds to a dominant pose of the subject and to identify any shots of the plurality of shots where the subject moved during acquisition. In certain embodiments, comparing the respective additional navigator like echoes comprises clustering the respective additional navigator like echoes (e.g., for a given slice for a given coil for a given NEX) to obtain positioning information to predict any shot where the subject moved during acquisition. In certain embodiments, the clustering of the additional navigator like echoes provides position information to remove outlier position shots. In certain embodiments, the predictions of shots where the subject moved may be collated using knowledge of the slice acquisition sequence, the acquisition strategy, and number of passes. In certain embodiments, the motion detection module 208 is configured to utilize a trained machine learning algorithm (e.g., support vector machine) to detect navigator like echoes with different random Gaussian noises belonging to the same or different poses.

Motion correction module 210 is configured to generate dominant pose k-space data based on identification of any shots of the plurality of shots where the subject moved during acquisition, the dominant pose k-space data including only shots of the plurality of shots not affected by movement of the subject during acquisition. The dominant pose k-space data is missing k-space data due to rejecting the shots where the subject moved during acquisition. In particular, a k-space mask is generated from the k-space data utilizing only the shots not affected by movement of the subject during acquisition (e.g., giving them a value of approximately 1), wherein the k-space mask is configured to mask the shots where the subject moved during acquisition (e.g. giving them a value of approximately 0). The motion correction module 210 is configured to apply the k-space mask to the k-space data to generate the dominant pose k-space data.

The motion correction module 210 includes a reconstruction model, which may be a ML/DL model, which may be configured to reconstruct images from k-space data. In some examples, the reconstruction model may be an unrolled deep learning model having a suitable architecture, such as deep learning unit as regularizer and a data consistency step (such as proximal mapping, alternating direction method of multipliers (ADMM), etc.). The reconstruction model is utilized on the motion-corrupted k-space data to modify the motion-corrupted k-space data with k-space data that is consistent with the dominant pose k-space data to generate a reconstructed (e.g., motion artifact free) MR image. In particular, utilizing the deep learning-based reconstruction model on the motion-corrupted k-space data include the following actions. The actions includes transforming the motion-corrupted k-space data to a motion-corrupted image. The actions also include transforming centrally located phase encoded lines (e.g., obtained from both motion-corrupted and uncorrupted shots) from the k-space data into a contrast image. The actions further include inputting both the motion-corrupted image and the contrast image into the deep learning-based reconstruction model, wherein the dominant pose k-space data is utilized for application of soft data consistency in an unrolled framework. The actions even further include outputting from the deep learning-based reconstruction model the reconstructed image based on both the motion-corrupted image and the contrast image. In certain embodiments, only the motion-corrupted image is inputted (without the contrast image) into the deep learning-based reconstruction model, wherein the dominant pose k-space data is utilized for application of soft data consistency in an unrolled framework. In these embodiments, the actions include outputting from the deep learning-based reconstruction model the reconstructed image based on motion-corrupted image.

Non-transitory memory 206 may further store a training module 212, which may comprise instructions for training one or more of the ML models stored in motion detection module 208 and/or motion correction module 210. Training module 212 may include instructions that, when executed by the processor 204, cause the image processing system 202 to conduct one or more of the steps of a training method for training the reconstruction model to reconstruct images from motion-affected k-space data, as discussed in more detail below in reference to FIG. 7. Training module 212 may include training datasets for the one or more ML models of motion detection module 208 and/or motion correction module 210.

Non-transitory memory 206 further stores k-space/image database 214. The k-space/image database 214 may include, for example, k-space data acquired via an MRI system and images reconstructed from the k-space data. For example, k-space/image database 214 may store k-space data acquired via MRI system 100, and/or received from other communicatively coupled MRI systems or image databases. In some examples, k-space/image database 214 may store images reconstructed by motion correction module 210. The k-space/image database 214 may further include one or more training datasets for training the one or more ML models of motion detection module 208 and/or motion correction module 210.

In some embodiments, non-transitory memory 206 may include components disposed at two or more devices, which may be remotely located and/or configured for coordinated processing. In some embodiments, one or more aspects of non-transitory memory 206 may include remotely-accessible networked storage devices configured in a cloud computing configuration.

User input device 232 may comprise one or more of a touchscreen, a keyboard, a mouse, a trackpad, a motion sensing camera, or other device configured to enable a user to interact with and manipulate data within image processing system 202. In one example, user input device 232 may enable a user to make a selection of k-space data to use in training a machine learning model, or for further processing using a trained machine learning model (e.g., the reconstruction model disclosed herein).

Display device 234 may include one or more display devices utilizing virtually any type of technology. In some embodiments, display device 234 may comprise a computer monitor, and may display MR images, including images reconstructed by motion correction module 210. Display device 234 may be combined with processor 204, non-transitory memory 206, and/or user input device 232 in a shared enclosure, or may be peripheral display devices and may comprise a monitor, touchscreen, projector, or other display device known in the art, which may enable a user to view MRI images produced by an MRI system, and/or interact with various data stored in non-transitory memory 206.

It should be understood that image processing system 202 shown in FIG. 2 is for illustration, not for limitation. Another appropriate image processing system may include more, fewer, or different components.

Figure 3:
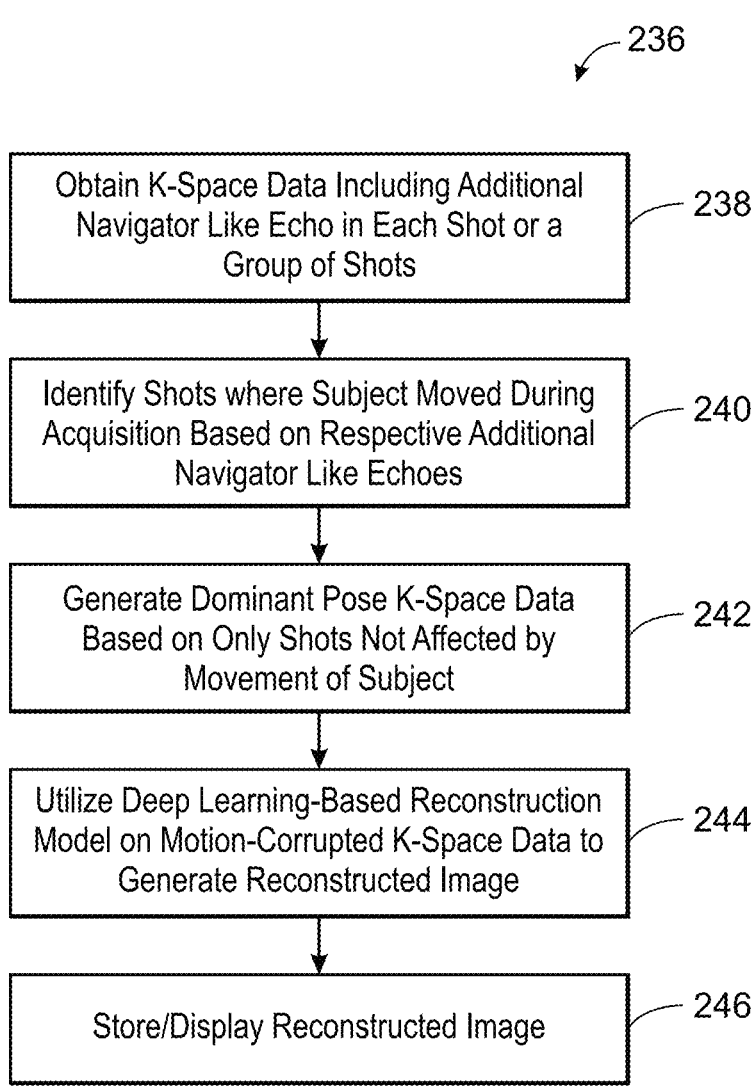
FIG. 3 illustrates a flow diagram of a method for image processing of MR data, in accordance with aspects of the present disclosure.

FIG. 3 illustrates a flow diagram of a method 236 for image processing of MR data. One or more steps of the method 236 may be performed by processing circuitry of the magnetic resonance imaging system 100 in FIG. 1 or a remote computing device. One or more of the steps of the method 236 may be performed simultaneously or in a different order from the order depicted in FIG. 3.

The method 236 includes obtaining k-space data of a subject acquired with a magnetic resonance imaging (MRI) scanner, wherein a plurality of navigator like echoes of the k-space data (representing the plurality of echoes received in a same repetition after an excitation pulse for a respective shot) including an additional navigator like echo are acquired for each shot or a group of shots of a plurality of shots for a respective slice (block 238). Each additional navigator like echo may be a near-center (within 10 percent) phase encode line, frequency encode line, a clover leaf acquisition, or other type of navigator like echo. The k-space data may be motion-corrupted. In certain embodiments, the k-space data is acquired with multiple coils over a plurality of excitations (i.e., a number of excitations (NEX) or number of signal averages per acquisition) in which multiple shots will be acquired during each excitation. In certain embodiments, the additional navigator like echo is acquired at a start, a middle, or end of each shot of the plurality of shots for the respective slice where the additional navigator like echo is acquired. In certain embodiments, the additional navigator like echo is a near-zero phase encode line which is located in the central 10 percent region of the k-space. The position and trajectory of the additional navigator like echo is the same across the plurality of shots.

The method 236 also includes identifying any shots of the plurality of shots where the subject moved during acquisition (i.e., motion-corrupted shots) based on the respective additional navigator like echoes for the plurality of shots (block 240). In certain embodiments, the method 236 includes comparing the respective additional navigator like echoes for the plurality of shots to identify a subset of shots of the plurality of shots that corresponds to a dominant pose of the subject and to identify any shots of the plurality of shots where the subject moved during acquisition. In certain embodiments, comparing the respective additional navigator like echoes comprises clustering the respective additional navigator like echoes (e.g., for a given slice for a given coil for a given NEX) to obtain positioning information to predict any shot where the subject moved during acquisition. In certain embodiments, the clustering of the additional navigator like echoes provides position information to remove outlier position shots. In certain embodiments, the predictions of shots where the subject moved may be collated using knowledge of the slice acquisition sequence, acquisition strategy, and number of passes.

The method 236 further includes generating dominant pose k-space data based on identification of any shots of the plurality of shots where the subject moved during acquisition, the dominant pose k-space data including only shots of the plurality of shots not affected by movement of the subject (i.e., motion free shots) during acquisition (block 242). The dominant pose k-space data is missing k-space data due to rejecting the shots where the subject moved during acquisition. In particular, a k-space mask is generated from the k-space data utilizing only the shots not affected by movement of the subject during acquisition (e.g., giving them a value of approximately 1), wherein the k-space mask is configured to mask the shots where the subject moved during acquisition (e.g. giving them a value of approximately 0). The k-space mask is applied to the k-space data to generate the dominant pose k-space data.

The method 236 even further includes utilizing a deep learning-based reconstruction model (e.g., an unrolled deep learning-based reconstruction model) on the motion-corrupted k-space data to modify the motion-corrupted k-space data with k-space data that is consistent with the dominant pose k-space data to generate a reconstructed image (e.g., motion corrected image) (block 244). The method 236 still further includes storing and/or displaying the reconstructed image (block 246).

Figure 4:
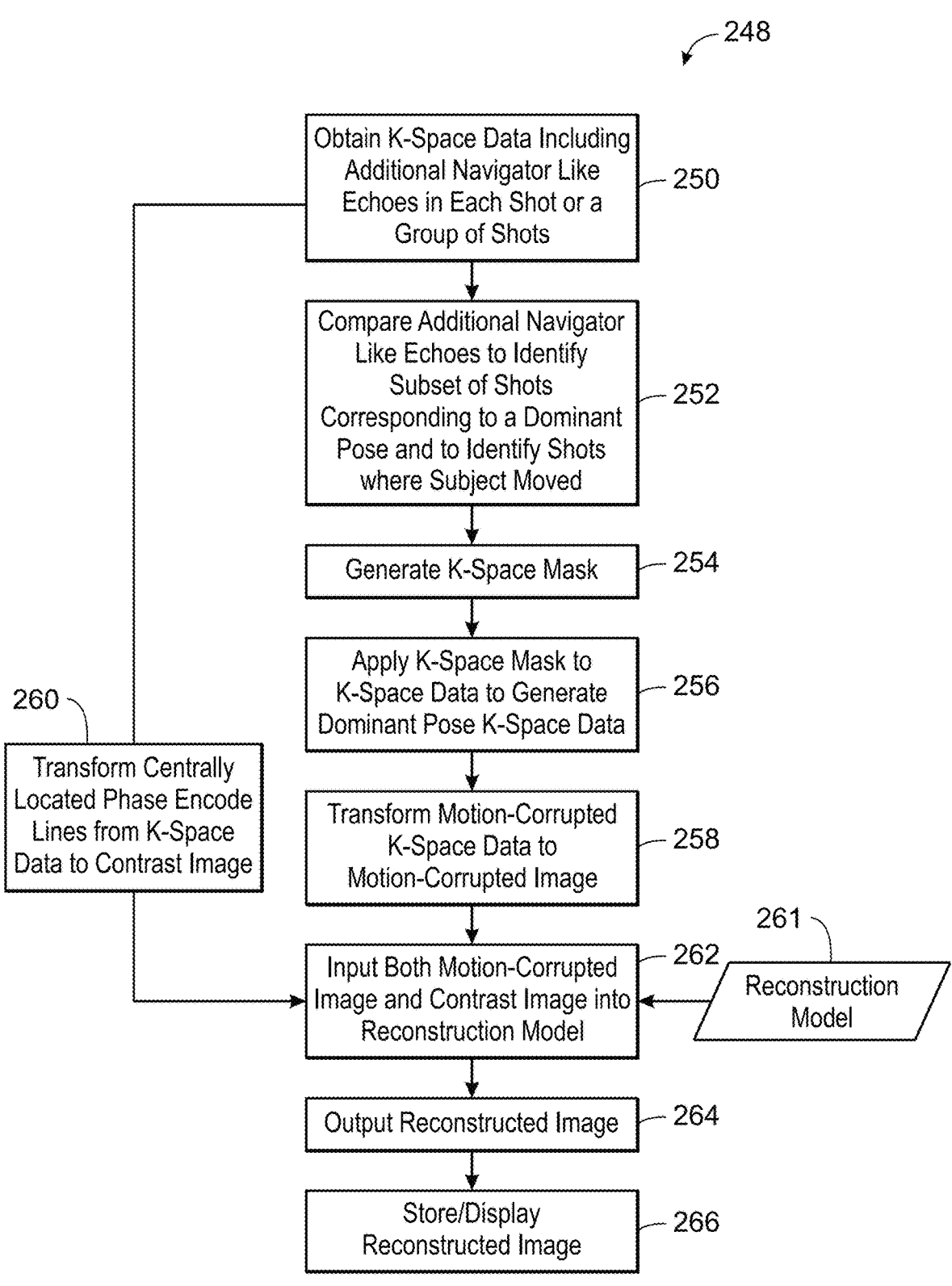
FIG. 4 illustrates a flow diagram of a more detailed method for image processing of MR data, in accordance with aspects of the present disclosure.

FIG. 4 illustrates a flow diagram of a more detailed method 248 for image processing of MR data. One or more steps of the method 248 may be performed by processing circuitry of the magnetic resonance imaging system 100 in FIG. 1 or a remote computing device. One or more of the steps of the method 248 may be performed simultaneously or in a different order from the order depicted in FIG. 4.

The method 248 includes obtaining k-space data of a subject acquired with a magnetic resonance imaging (MRI) scanner utilizing a multi-shot pulse sequence (e.g., fast spin echo sequence), wherein a plurality of navigator like echoes of the k-space data (representing the plurality of echoes received in a same repetition after an excitation pulse for a respective shot) including an additional navigator like echo (representing an additional echo) are acquired for each shot or a group of shots of a plurality of shots for a respective slice (block 250). Each additional navigator like echo may be a near-center (within 10 percent) phase encode line, frequency encode line, a clover leaf acquisition, or other type of navigator like echo. The k-space data may be motion-corrupted. In certain embodiments, the k-space data is acquired with multiple coils over a plurality of excitations (i.e., a number of excitations (NEX) or number of signal averages per acquisition) in which multiple shots will be acquired during each excitation. In certain embodiments, the additional navigator like echo is acquired at a start, a middle, or an end of each shot of the plurality of shots for the respective slice where the additional navigator like echo is acquired. In certain embodiments, the additional navigator like echo is a near-zero phase encode line which is located in the central 10 percent region of the k-space. The position and trajectory of the additional navigator like echo is the same across the plurality of shots.

The method 248 also includes comparing the respective additional near-zero navigator like echoes for the plurality of shots to identify a subset of shots of the plurality of shots that corresponds to the dominant pose of the subject and to identify any shots of the plurality of shots where the subject moved during acquisition (block 252). In certain embodiments, comparing the respective navigator like echoes comprises clustering the respective additional navigator like echoes (e.g., for a given slice for a given coil for a given NEX) to obtain positioning information to predict any shot where the subject moved during acquisition. In certain embodiments, the clustering of the additional navigator like echoes provides position information to remove outlier position shots. In certain embodiments, the predictions of shots where the subject moved may be collated using knowledge of the slice acquisition sequence, the acquisition strategy, and number of passes.

The method 248 further includes generating a k-space mask from the k-space data utilizing only the shots not affected by movement of the subject during acquisition (e.g., giving them a value of approximately 1), wherein the k-space mask is configured to mask the shots where the subject moved during acquisition (e.g. giving them a value of approximately 0) (block 254). The method 248 even further includes applying the k-space mask to the k-space data to generate dominant pose k-space data based on identification of any shots of the plurality of shots where the subject moved during acquisition (block 256). The dominant pose k-space data includes only shots of the plurality of shots not affected by movement of the subject during acquisition. The dominant pose k-space data is missing k-space data due to rejecting the shots where the subject moved during acquisition.

The method 248 even further transforming the motion-corrupted k-space data to motion-corrupted image (block 258). The method 248 includes transforming centrally located phase encoded lines (e.g., obtained from both motion-corrupted and uncorrupted shots) from the k-space data into a contrast image (block 260). In certain embodiments, the method 248 also includes inputting both the motion-corrupted image and the contrast image into a deep learning-based reconstruction model 261 (e.g., an unrolled deep learning-based reconstruction model), wherein the dominant pose k-space data is utilized for application of soft data consistency in an unrolled framework (block 262). The method 248 further includes outputting from the deep learning-based reconstruction model a reconstructed image (e.g., motion corrected image) based on both the motion-corrupted image and the contrast image (block 264). The deep learning-based reconstruction model modifies motion-corrupted k-space data with k-space data that is consistent with the dominant pose k-space data to generate the motion free reconstructed image. In certain embodiments, only the motion-corrupted image is inputted (without the contrast image) into the deep learning-based reconstruction model, wherein the dominant pose k-space data is utilized for application of soft data consistency in an unrolled framework. In these embodiments, the actions include outputting from the deep learning-based reconstruction model the reconstructed image based on the motion-corrupted image. The method 248 still further includes storing and/or displaying the reconstructed image (e.g., motion corrected image) (block 266).

Figure 5:
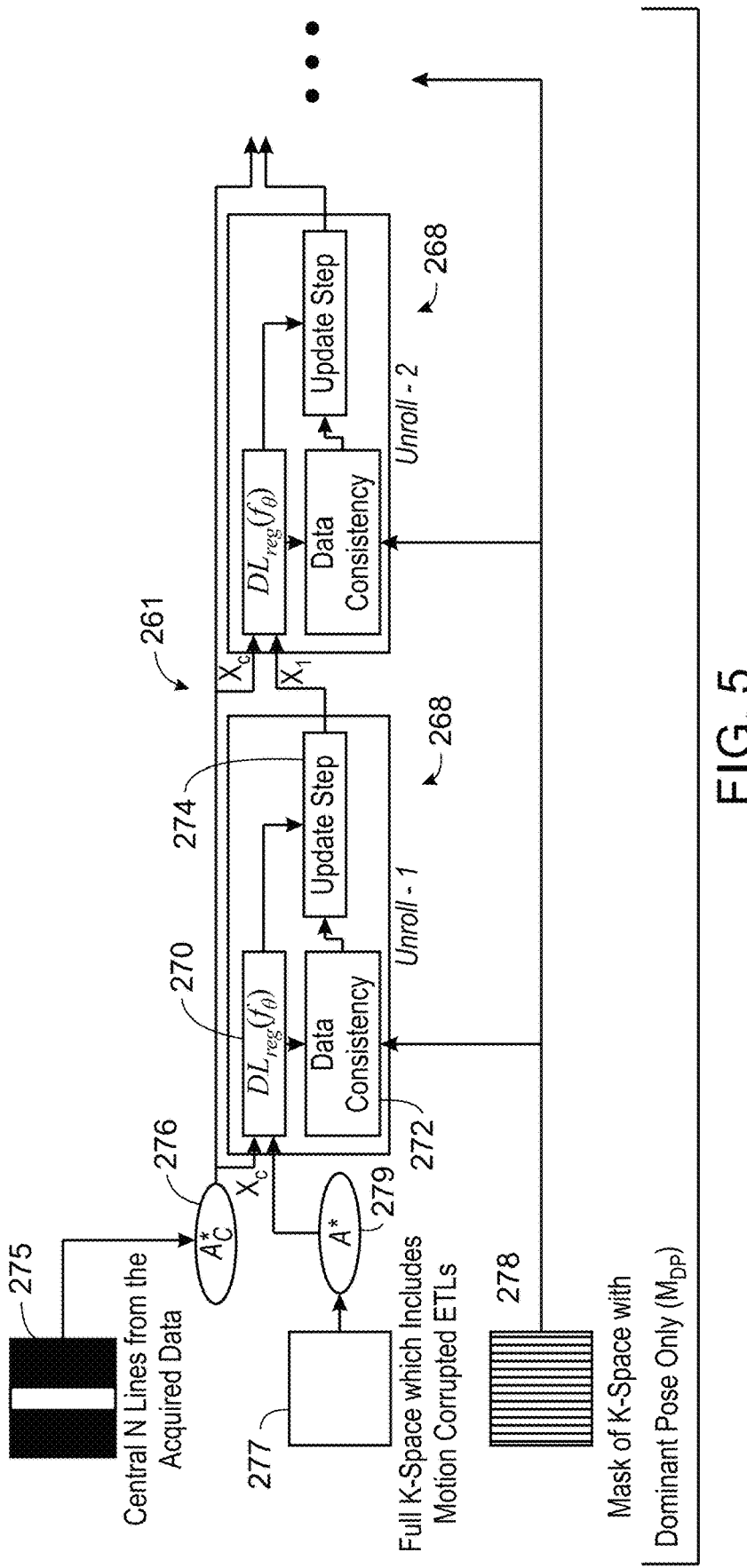
FIG. 5 is a schematic diagram illustrating reconstruction utilizing information from motion detection, in accordance with aspects of the present disclosure.

FIG. 5 is a schematic diagram illustrating reconstruction utilizing information from motion detection. FIG. 5 depicts the unrolled deep learning-based reconstruction model 261. As depicted, the unrolled deep learning-based reconstruction model 261 includes a number of unrolling steps 268. Each unrolling step 268 includes a deep learning-based (e.g. CNN-based) regularizer unit 270 ($DL_{reg}(f_\theta)$) and a data consistency unit 272. In addition, each unrolling step 268 includes an update step 274.

The unrolled deep learning-based reconstruction model 261 has a two channel input. As depicted, centrally located phase encoded lines (e.g., obtained from both motion-corrupted and uncorrupted shots) from the k-space data 275 are transformed into a contrast image as indicated by reference numeral 276 and is inputted into the regularizer unit 270 (as $x_C$) via one channel into each unrolling step 268. In certain embodiments, the contrast image is inputted via two channels into the regularizer unit 270. The image provides contrast information that is always available for reconstruction. Inputting this image is better than 1) passing the dominant pose only data where the contrast would be affected by motion, thus, making reconstruction useless and 2) the entire image as-it-is (i.e., including all of the data (motion and motion-corrupted data)) since it would put an extra burden on the regularizer unit 270 to separate artifacts from the signal.

A k-space mask 278 ($M_{DP}$) is applied to the k-space data to generate dominant pose k-space data. The k-space mask 278 is generated from the k-space data utilizing only the shots not affected by movement of the subject during acquisition (e.g., giving them a value of approximately 1), wherein the k-space mask is configured to mask the shots where the subject moved during acquisition (e.g. giving them a value of approximately 0). The dominant pose k-space data includes only shots of the plurality of shots not affected by movement of the subject during acquisition. The dominant pose k-space data is missing k-space data due to rejecting the shots where the subject moved during acquisition. The motion-corrupted k-space data 277 is transformed to a motion-corrupted image (as indicated by reference numeral 279) that is inputted into the regularizer unit 270 via two channels into the first unrolling step 268. The k-space mask 278 is inputted into the data consistency unit 272 of each unrolling step 268 along with the dominant pose k-space data. Data fidelity terms are obtained from the regularizer unit 270 which estimates the value from the motion-corrupted data and the contrast image obtained from the few lines around the center of k-space (contrast only information to ensure image reconstruction is not affected when lines around DC are affected by motion). At each rolling step 268, the following equation is utilized by the regularizer unit 270 and the data consistency unit 272:

$$\min_{x} \|y - M_{DP} \cdot F \cdot x\|_2^2 + \lambda \|x - f_\theta(x, x_C)\|_2^2, . \quad (1)$$

where y is the dominant pose k-space, x is the motion corrupt image acquired, $M_{DP}$ is the dominant pose mask for the k-space, $x_C$ is the contrast image, $f_\theta$ is the DL convolutional operator, and F represents the 2D Fourier transform operation.

The update step 274 utilizes the following equation to generate an output image (e.g., $x_1$ outputted from the first unrolling step 268) from the respective unrolling step 268:

$$X_{rec}(k) = \left\{ \frac{Ff_\theta(k) + \lambda X_{M_{DP}}(k)}{1 + \lambda}, \text{ when 'k' is 1 in } M_{DP} \quad (2) \right.$$

and $$X_{rec}(k) = \left\{ \frac{Ff_\theta(k)}{1 + \lambda}, \text{ when 'k' is 0 in } M_{DP}, \quad (3) \right.$$

where $X_{rec}(k)$ represents the k-space information at kth position of the reconstructed image at the end of an unrolling step, $F_\theta(k)$ represents deep learning-predicted image of the unrolling step, and $X_{M_{DP}}(k)$ represents the original image as acquired. The deep learning-based reconstruction model 261 utilizes data consistency priors on the k-space filled with shots in the dominant pose, while iteratively computing an image whose k-space for the dominant pose matches the acquired one, while filling in the non-dominant shots with the best possible data that is consistent with the dominant pose data. In certain embodiments, as depicted in FIG. 6, the k-space mask 278 and the motion-corrupted image are inputted into the deep learning-based reconstruction model 261 and a contrast image is not inputted.

Figure 6:
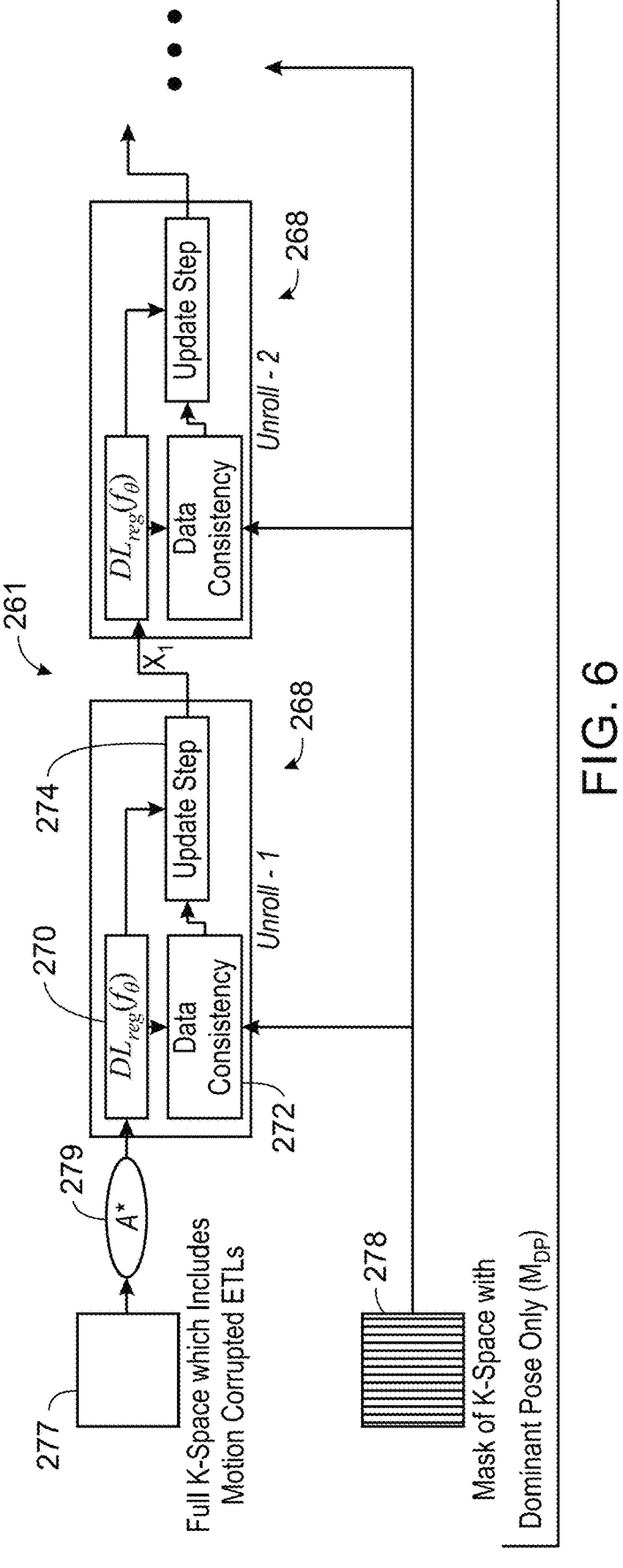
FIG. 6 is a schematic diagram illustrating reconstruction utilizing information from motion detection (e.g., utilizing motion-corrupted image without contrast image), in accordance with aspects of the present disclosure.
Figure 7:
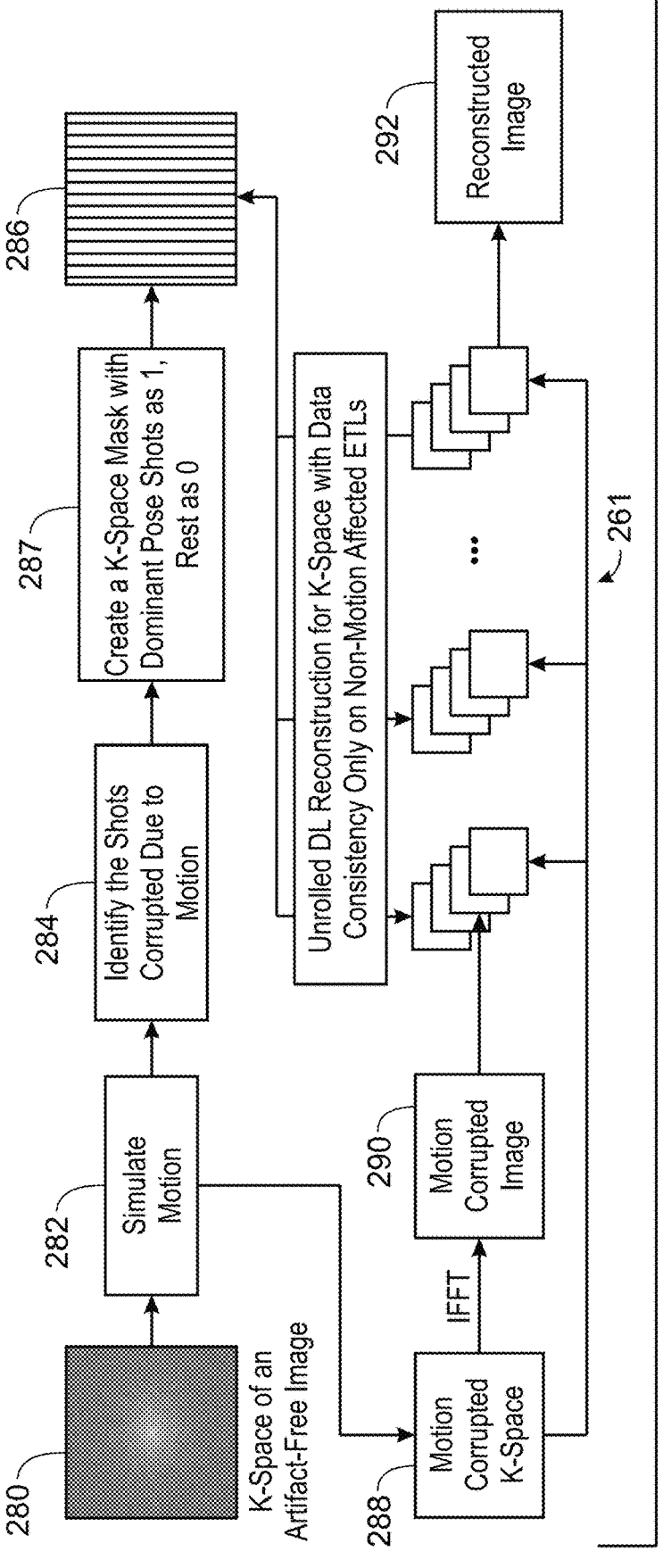
FIG. 7 is a schematic diagram illustrating training of a reconstruction model, in accordance with aspects of the present disclosure.

FIG. 7 is a schematic diagram illustrating training of the unrolled deep learning-based reconstruction model 261 in FIG. 6. As depicted, k-space data 280 of an artifact free-image is obtained. Motion is simulated in the k-space as indicated by block 282. Then shots are identified that corrupted due to motion as indicated by block 284. A k-space mask 286 is generated as indicated by block 287. The k-space mask 286 is generated from the k-space data utilizing only the shots not affected by movement of the subject during acquisition (e.g., giving them a value of approximately 1), wherein the k-space mask is configured to mask the shots where the subject moved during acquisition (e.g. giving them a value of approximately 0). The k-space mask 286 is configured to be applied to the k-space data to generate the dominant pose k-space data. The k-space mask 286 is also inputted into the deep learning-based reconstruction model 261.

Motion-corrupted k-space data 288 is also obtained from the k-space data 280 subjected to the simulated motion. The motion-corrupted k-space data 288 is transformed (via inverse fast Fourier transform (IFFT)) to generate a motion-corrupted image 290. The motion-corrupted image 290 is inputted into the deep learning-based reconstruction model 261. The motion-corrupted k-space data 288 is inputted into each rolling step of the unrolled deep learning-based reconstruction model 261. The k-space mask 286 is applied to the motion-corrupted k-space data 288. Also, center lines are obtained from the motion-corrupted k-space data for utilization in the deep learning-based reconstruction model 261. After the iterative unrolling steps, a reconstructed image 292 (e.g., motion-corrected image) is generated which may be compared to a ground truth image (i.e., the artifact-free image).

Figure 8:
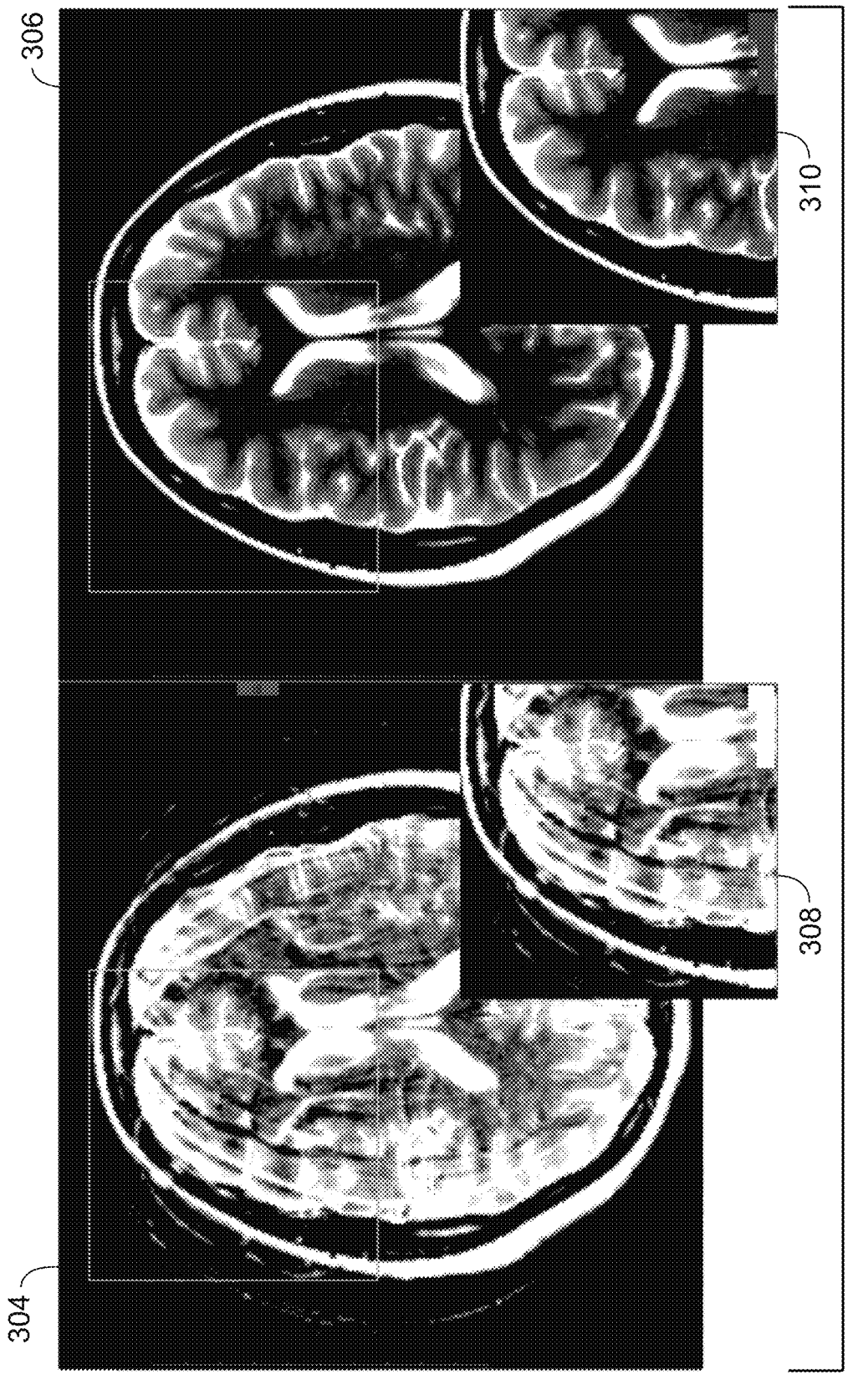
FIG. 8 depicts MR images of a brain before and after motion correction, in accordance with aspects of the present disclosure.

FIG. 8 depicts MR images 304 and 306 of a brain before and after motion correction. MR images 304 and 306 are axial views. The MR images 304 and 306 are a fast spin echo sequence acquisition. MR image 304 has not been subjected to motion correction. MR image 306 was motion corrected utilizing the method 236 in FIG. 3. Zoomed images 308 and 310 are of the same portion of the brain in MR images 304 and 306.

Figure 9:
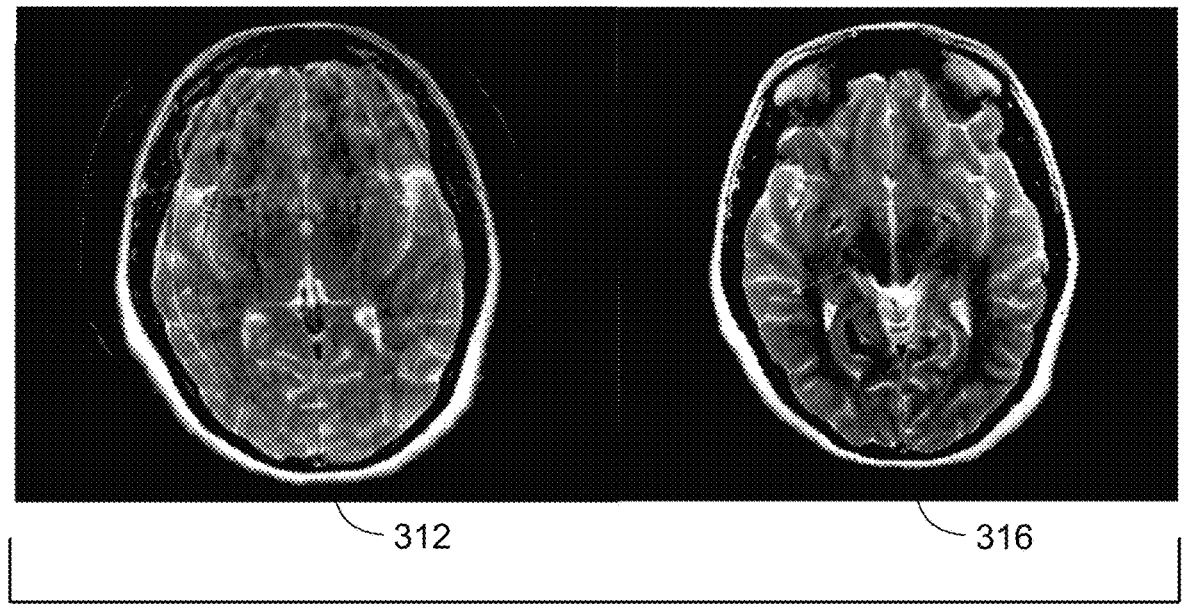
FIG. 9 depicts MR images of a brain before and after motion correction with different techniques (e.g., axial views of T2 fast spin echo sequence acquisition), in accordance with aspects of the present disclosure.

FIG. 9 depicts MR images 312 and 316 of a brain before and after motion correction with different techniques. MR images 312 and 316 are axial views. The MR images 312 and 316 are a T2 fast spin echo sequence acquisition. MR image 312 has not been subjected to motion correction. MR image 316 was motion corrected utilizing the method 236 in FIG. 3. In the current approach utilized to generate MR image 316 hyperintensity due to aliasing is removed. The detection of motion-corrupted data is more reliable with the current approach.

Figure 10:
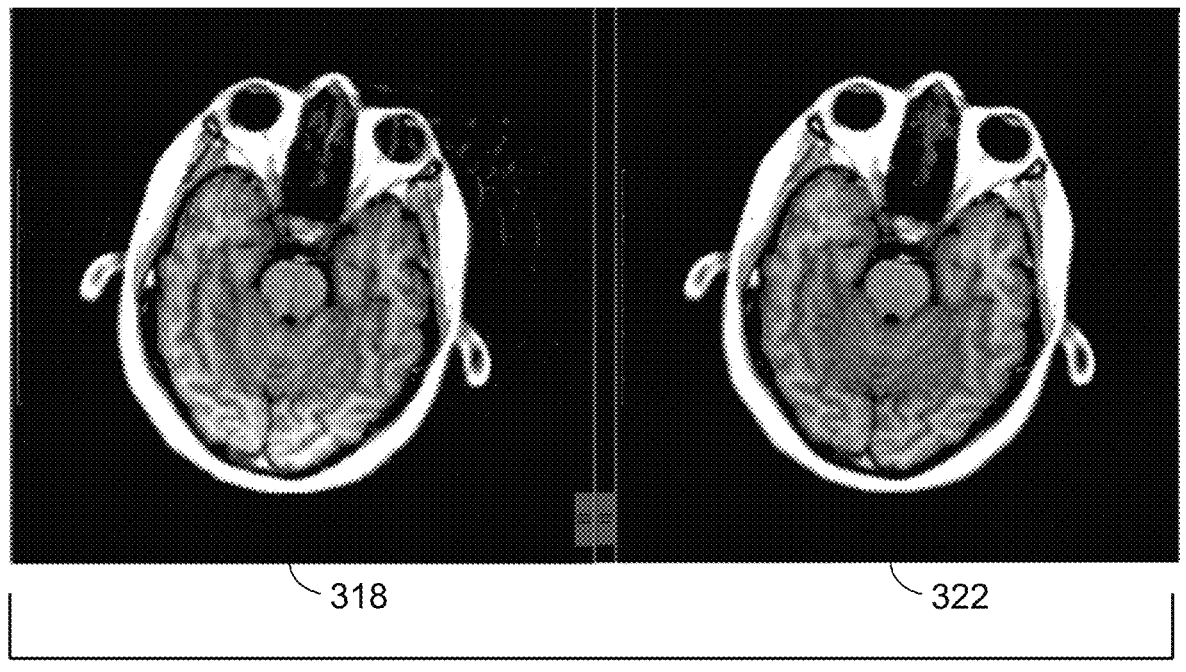
FIG. 10 depicts MR images of a brain before and after motion correction with different techniques(e.g., axial views of T1 FLAIR acquisition), in accordance with aspects of the present disclosure.

FIG. 10 depicts MR images 318 and 322 of a brain before and after motion correction with different techniques. MR images 318 and 322 are axial views. The MR images 318 and 322 are a T1 FLAIR acquisition. MR image 318 has not been subjected to motion correction. MR image 322 was motion corrected utilizing the method 236 in FIG. 3. The detection of motion-corrupted data is more reliable with the current approach.

Figure 11:
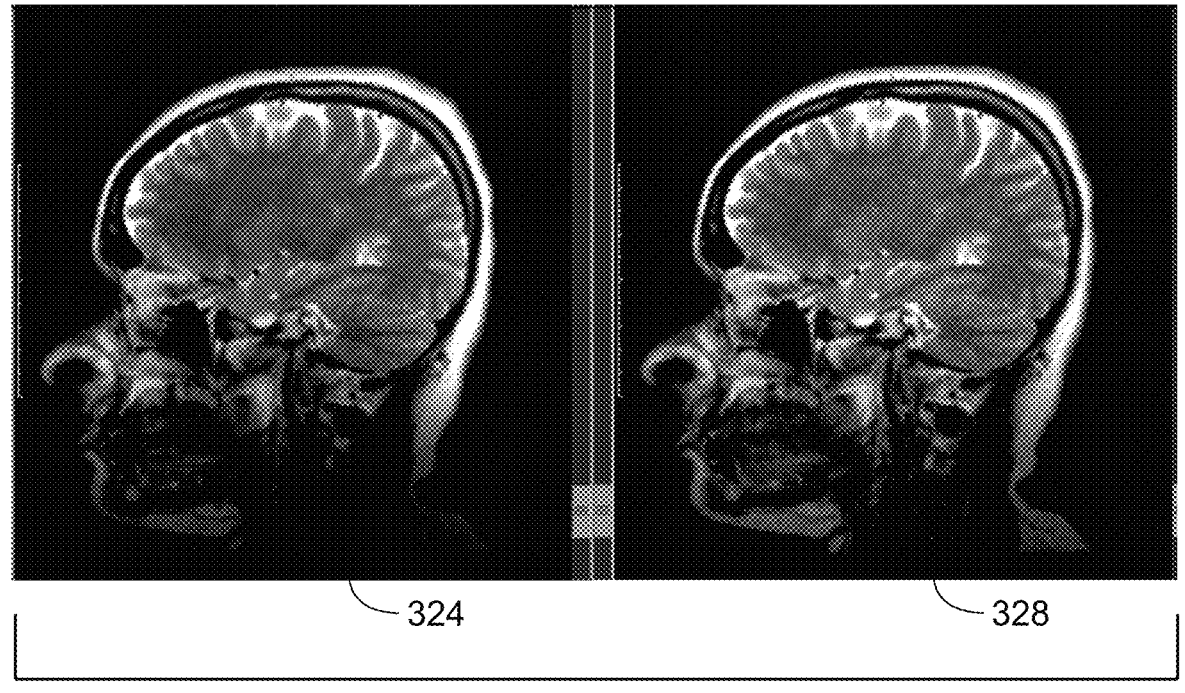
FIG. 11 depicts MR images of a brain before and after motion correction with different techniques (e.g., sagittal views of T2 fast spin echo sequence acquisition), in accordance with aspects of the present disclosure.

FIG. 11 depicts MR images 324 and 328 of a brain before and after motion correction with different techniques. MR images 324 and 328 are sagittal views. The MR images 324 and 328 are a T2 fast spin echo sequence acquisition. MR image 324 has not been subjected to motion correction. MR image 328 was motion corrected utilizing the method 236 in FIG. 3. The detection of motion-corrupted data is more reliable with the current approach.

Figure 12:
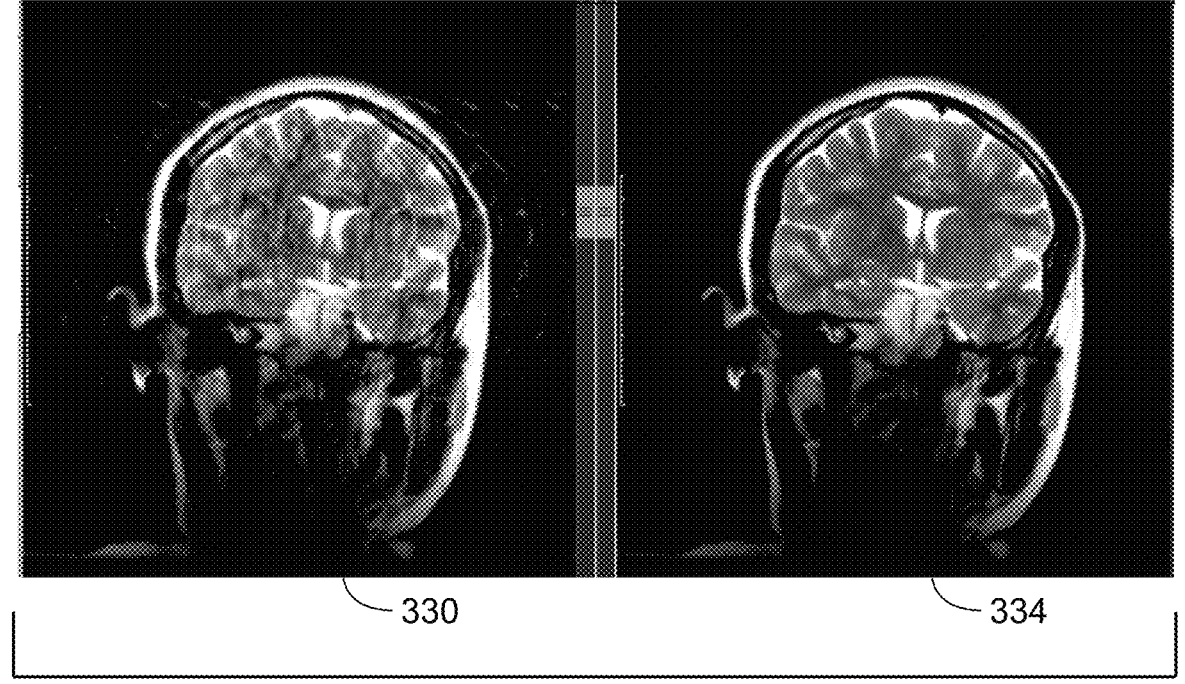
FIG. 12 depicts MR images of a brain before and after motion correction with different techniques (e.g., coronal views of T2 fast spin echo sequence acquisition), in accordance with aspects of the present disclosure.

FIG. 12 depicts MR images 330 and 334 of a brain before and after motion correction with different techniques. MR images 330 and 334 are coronal views. The MR images 330 and 334 are a T2 fast spin echo sequence acquisition. MR image 330 has not been subjected to motion correction. MR image 334 was motion corrected utilizing the method 236 in FIG. 3. The detection of motion-corrupted data is more reliable with the current approach.

Figure 13:
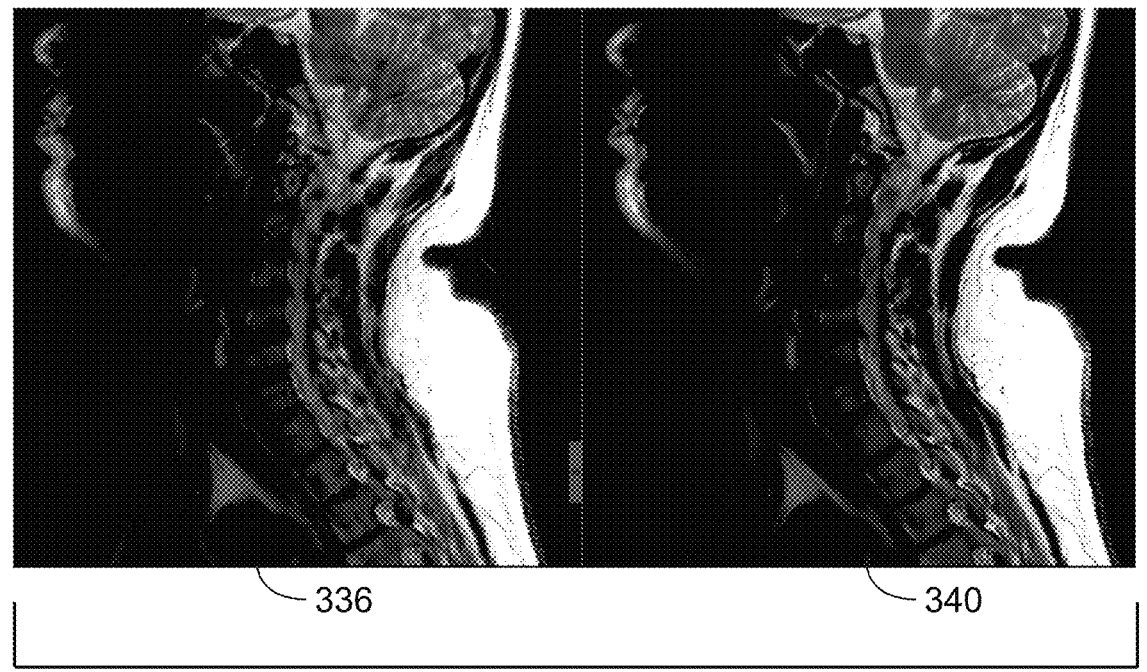
FIG. 13 depicts MR images of a spine before and after motion correction with different techniques, in accordance with aspects of the present disclosure.

FIG. 13 depicts MR images 336 and 340 of a spine before and after motion correction with different techniques. MR images 336 and 340 are sagittal views. The MR images 336, and 340 are a T2 fast spin echo sequence C-spine acquisition. MR image 336 has not been subjected to motion correction. MR image 340 was motion corrected utilizing the method 236 in FIG. 3. The detection of motion-corrupted data is more reliable with the current approach.

Technical effects of the disclosed subject matter include improving system throughput by reducing patient rescans/recalls due to motion related artifacts. Technical effects of the disclosed subject matter also includes improving patient comfort due to motion tolerance and less patient recall. Technical effects of the disclosed subject matter further include being helpful when scanning uncompliant patients and children/infants. Technical effects of the disclosed subject matter even further include being able to detect and to correct for in plane, out of plane, rigid, and non-rigid motion for all anatomies and contrasts.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A computer-implemented method, comprising:
   obtaining, via a processor, k-space data of a subject acquired with a magnetic resonance imaging (MRI) scanner, wherein a portion of the k-space data is motion corrupted, and wherein a plurality of navigator like echoes of the k-space data comprising an additional navigator like echo are acquired for each shot or a group of shots of a plurality of shots for a respective slice;
   identifying, via the processor, any shots of the plurality of shots where the subject moved during acquisition based on respective additional navigator like echoes for the plurality of shots;
   generating, via the processor, dominant pose k-space data based on identification of any shots of the plurality of shots where the subject moved during acquisition, the dominant pose k-space data comprising only shots of the plurality of shots not affected by movement of the subject during acquisition, wherein the dominant pose k-space data is missing k-space data due to rejecting the shots where the subject moved during acquisition; and
   utilizing, via the processor, a deep learning-based reconstruction model on the k-space data to modify the portion of the motion-corrupted k-space data that is motion corrupted with other k-space data that is consistent with the dominant pose k-space data to generate a reconstructed image from the k-space data, wherein utilizing the deep learning-based reconstruction model on the k-space data comprises:
   transforming the portion of the k-space data that is motion corrupted to a motion-corrupted image;
   transforming centrally located phase encoded lines from the k-space data into a contrast image, wherein the k-space data is derived from both a first set of shots where the subject moved during acquisition and a second set of shots not affected by movement of the subject during acquisition;
   inputting both the motion-corrupted image and the contrast image into the deep learning-based reconstruction model, wherein the dominant pose k-space data is utilized for application of soft data consistency in an unrolled framework; and
   outputting from the deep learning-based reconstruction model the reconstructed image.

2. The computer-implemented method of claim 1, wherein the additional navigator like echo is acquired at a start, a middle, or an end of each shot of the plurality of shots for the respective slice where the additional navigator like echo is acquired.

3. The computer-implemented method of claim 1, further comprising comparing the respective additional navigator like echoes for the plurality of shots to identify a subset of shots of the plurality of shots that corresponds to a dominant pose of the subject and to identify any shots of the plurality of shots where the subject moved during acquisition.

4. The computer-implemented method of claim 3, wherein comparing the respective additional navigator like echoes comprises clustering the respective additional navigator like echoes to obtain positioning information to predict any shot where the subject moved during acquisition.

5. The computer-implemented method of claim 1, further comprising:
   generating, via the processor, a k-space mask from the k-space data utilizing only the shots not affected by movement of the subject during acquisition, wherein the k-space mask is configured to mask the shots where the subject moved during acquisition; and
   applying, via the processor, the k-space mask to the k-space data to generate the dominant pose k-space data.

6. A system, comprising:
   a memory encoding processor-executable routines; and
   a processor configured to access the memory and to execute the processor-executable routines, wherein the processor-executable routines, when executed by the processor, cause the processor to:
      obtain k-space data of a subject acquired with a magnetic resonance imaging (MRI) scanner, wherein a portion of the k-space data is motion corrupted, and wherein a plurality of navigator like echoes of the k-space data comprising an additional navigator like echo are acquired for each shot or a group of shots of a plurality of shots for a respective slice;
      identify any shots of the plurality of shots where the subject moved during acquisition based on respective additional navigator like echoes for the plurality of shots;
      generate dominant pose k-space data based on identification of any shots of the plurality of shots where the subject moved during acquisition, the dominant pose k-space data comprising only shots of the plurality of shots not affected by movement of the subject during acquisition, wherein the dominant pose k-space data is missing k-space data due to rejecting the shots where the subject moved during acquisition; and utilize a deep learning-based reconstruction model on the k-space data to modify the portion of the k-space data that is motion corrupted with other k-space data that is consistent with the dominant pose k-space data to generate a reconstructed image from the k-space data, wherein utilizing the deep learning-based reconstruction model on the k-space data comprises:

transforming the portion of k-space data that is motion corrupted to a motion-corrupted image;

transforming centrally located phase encoded lines from the k-space data into a contrast image, wherein the k-space data is derived from both a first set of shots where the subject moved during acquisition and a second set of shots not affected by movement of the subject during acquisition;

inputting both the motion-corrupted image and the contrast image into the deep learning-based reconstruction model, wherein the dominant pose k-space data is utilized for application of soft data consistency in an unrolled framework; and outputting from the deep learning-based reconstruction model the reconstructed image.

7. The system of claim 6, wherein the additional navigator like echo is acquired at a start, a middle, or an end of each shot of the plurality of shots for the respective slice where the additional navigator like echo is acquired.

8. The system of claim 6, wherein the processor-executable routines, when executed by the processor, further cause the processor to compare the respective additional navigator like echoes for the plurality of shots to identify a subset of shots of the plurality of shots that corresponds to a dominant pose of the subject and to identify any shots of the plurality of shots where the subject moved during acquisition.

9. The system of claim 8, wherein comparing the respective additional navigator like echoes comprises clustering the respective additional navigator like echoes to obtain positioning information to predict any shot where the subject moved during acquisition.

10. The system of claim 6, wherein the processor-executable routines, when executed by the processor, further cause the processor to:

generate a k-space mask from the k-space data utilizing only the shots not affected by movement of the subject during acquisition, wherein the k-space mask is configured to mask the shots where the subject moved during acquisition; and apply the k-space mask to the k-space data to generate the dominant pose k-space data.

11. A non-transitory computer-readable medium, the non-transitory computer-readable medium comprising processor-executable code that when executed by a processor, causes the processor to:

obtain k-space data of a subject acquired with a magnetic resonance imaging (MRI) scanner, wherein a portion of the k-space data is motion corrupted, and wherein a plurality of navigator like echoes of the k-space data comprising an additional navigator like echo are acquired for each shot or a group of shots of a plurality of shots for a respective slice;

identify any shots of the plurality of shots where the subject moved during acquisition based on respective additional navigator like echoes for the plurality of shots;

generate dominant pose k-space data based on identification of any shots of the plurality of shots where the subject moved during acquisition, the dominant pose k-space data comprises only shots of the plurality of shots not affected by movement of the subject during acquisition, wherein the dominant pose k-space data is missing k-space data due to rejecting the shots where the subject moved during acquisition; and utilize a deep learning-based reconstruction model on the k-space data to modify the portion of the k-space data that is motion corrupted with other k-space data that is consistent with the dominant pose k-space data to generate a reconstructed image from the k-space data, wherein utilizing the deep learning-based reconstruction model on the k-space data comprises:

transforming the portion of the k-space data that is motion corrupted to a motion-corrupted image;

transforming centrally located phase encoded lines from the k-space data into a contrast image, wherein the k-space data is derived from both a first set of shots where the subject moved during acquisition and a second set of shots not affected by movement of the subject during acquisition;

inputting both the motion-corrupted image and the contrast image into the deep learning-based reconstruction model, wherein the dominant pose k-space data is utilized for application of soft data consistency in an unrolled framework; and outputting from the deep learning-based reconstruction model the reconstructed image.

12. The non-transitory computer-readable medium of claim 11, wherein the additional navigator like echo is acquired at a start, a middle, or an end of each shot of the plurality of shots for the respective slice where the additional navigator like echo is acquired.

13. The non-transitory computer-readable medium of claim 11, wherein the processor-executable code, when executed by the processor, further cause the processor to compare the respective additional navigator like echoes for the plurality of shots to identify a subset of shots of the plurality of shots that corresponds to a dominant pose of the subject and to identify any shots of the plurality of shots where the subject moved during acquisition.

14. The non-transitory computer-readable medium of claim 11, wherein the processor-executable code, when executed by the processor, further cause the processor to:

generate a k-space mask from the k-space data utilizing only the shots not affected by movement of the subject during acquisition, wherein the k-space mask is configured to mask the shots where the subject moved during acquisition; and apply the k-space mask to the k-space data to generate the dominant pose k-space data.

* * * * *